(12) United States Patent
Ishihara et al.

(10) Patent No.: US 6,429,687 B1
(45) Date of Patent: Aug. 6, 2002

(54) SEMICONDUCTOR INTEGRATED CIRCUIT DEVICE

(75) Inventors: Fujio Ishihara, Tokyo-To; Yukihiro Urakawa, Kawasaki; Yukihiro Fujimoto, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/489,889

(22) Filed: Jan. 24, 2000

(30) Foreign Application Priority Data

Jan. 4, 2000 (JP) ........................... 2000-000118

(51) Int. Cl.$^7$ ............................................. H03K 19/00
(52) U.S. Cl. ............................. 326/93; 326/63; 326/95; 326/97; 326/121
(58) Field of Search .......................... 326/63, 93, 95, 326/97, 98, 121; 327/292, 295, 297

(56) References Cited

U.S. PATENT DOCUMENTS

| | | | | |
|---|---|---|---|---|
| 3,751,591 A | * | 8/1973 | Radcliffe et al. | 375/354 |
| 5,087,829 A | * | 2/1992 | Ishibashi et al. | 327/152 |
| 5,332,934 A | * | 7/1994 | Hashimoto et al. | 326/63 |
| 5,486,783 A | * | 1/1996 | Baumert et al. | 327/147 |
| 5,668,484 A | * | 9/1997 | Nomura | 326/93 |
| 5,705,942 A | * | 1/1998 | Ashuri | 326/93 |
| 5,726,583 A | * | 3/1998 | Kaplinsky | 326/30 |
| 5,732,249 A | * | 3/1998 | Masuda et al. | 713/503 |
| 5,760,610 A | * | 6/1998 | Naffziger | 326/93 |
| 5,831,459 A | * | 11/1998 | McDonald | 327/141 |

OTHER PUBLICATIONS

Eby G. Friedman, "Clock Distribution Networks in VLSI Circuits and Systems"; IEEE Circuits and Systems Society; 1995, p. 5.

Scot Boon et al., "High Performance Clock Distribution for CMOS ASICS," Proc. IEEE Custom Integrated Circuits Conf., May 1989, p. 260.

* cited by examiner

Primary Examiner—Michael G. Lee
Assistant Examiner—Steven S. Paik
(74) Attorney, Agent, or Firm—Foley & Lardner (57) ABSTRACT

A semiconductor integrated circuit device comprises: a clock driver for outputting a clock signal; a clock wiring which is driven by the clock driver for transmitting the clock signal; a plurality of logic circuits which are connected to the clock wiring to be synchronously operated in response to the clock signal; and a plurality of delay circuits, each of which is provided between a corresponding one of the logic circuits and the clock wiring for delaying the clock signal, wherein a delay amount of each of the delay circuits is designed so that the delay amounts of the clock signal from the output of the clock driver to the inputs of the logic circuits are equal to each other. Thus, it is possible to reduce clock skew and to evade an increase in layout area.

9 Claims, 8 Drawing Sheets

SEMICONDUCTOR INTEGRATED CIRCUIT DEVICE

BACKGROUND OF THE INVENTION

1. Field of the Invention

The present invention relates generally to a semiconductor integrated circuit device including synchronously operating logic circuits.

2. Description of the Prior Art

In recent years, with the large scale integration of logic circuits, the difference between propagation delay times of clock signals in a clock tree for driving a synchronous circuit, i.e., the bad influence of clock skew on the high speed operation of the logic circuits, has caused serious problems.

Figure 11:
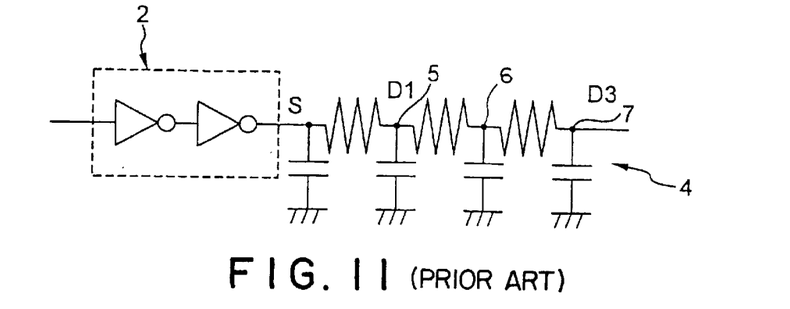
FIG. 11 is a circuit diagram of a conventional semiconductor integrated circuit device.
Figure 12:
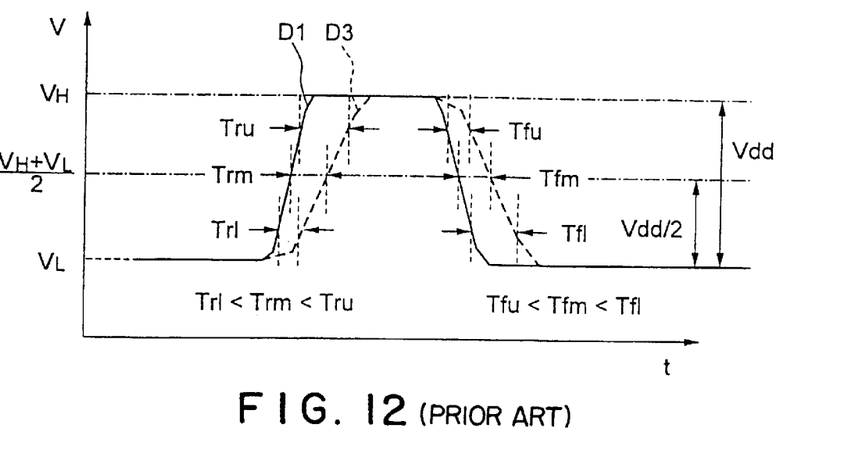
FIG. 12 is a graph showing the operation of the device shown in FIG. 11.

If the large scale integration and scale down of a logic circuit proceeds, the wiring resistance of the logic circuit increases as the decrease of the wiring width thereof, so that the RC delay thereof becomes conspicuous. In such a situation, many techniques for reducing clock skew have been devised. Referring to FIGS. 11 and 12, the characteristics of the delay caused by the parasitic RC of wiring will be described below.

FIG. 11 is a circuit diagram of a semiconductor integrated circuit device comprising a clock driver 2 and an RC-distributed network 4 which is driven by the clock driver 2 to serve as a clock wiring and which comprises resistors and capacitors. FIG. 12 shows the observed waveforms D1 and D3 of voltages at nodes 5 and 7 on the RC-distributed network 4. The wiring lengths from the output S of the clock driver 2 to the nodes 5 and 7 are different. Since the wiring length from the clock driver 2 to the node 7 is longer than that to the node 5, the voltage waveform D3 at the node 7 is delayed from the voltage waveform D1 at the node 5 (see FIG. 12). As the transition in voltage proceeds, the delay amount increases regardless of the direction of the transition in voltage. Therefore, assuming that a power supply voltage is $V_{dd}$, the delay amount of the waveform D3 from the waveform D1 at an intermediate voltage $(=(V_H+V_L)/2)$ when the voltage changes from $V_L$ to $V_H(=V_L+V_{dd})$ is $T_{rm}$, the delay amount of the waveform D3 from the waveform D1 at a voltage between the voltage $V_L$ and the intermediate voltage is $T_{rl}$ the delay amount of the waveform D3 from the waveform D1 at a voltage between the intermediate voltage and the voltage $V_H$ is $T_{ru}$, the delay amount of the waveform D3 from the waveform D1 at the intermediate voltage when the voltage changes from $V_H$ to $V_L$ is $T_{fm}$, the delay amount of the waveform D3 from the waveform D1 at a voltage between the voltage $V_H$ and the intermediate voltage is $T_{fu}$, and the delay amount of the waveform D3 from the waveform D1 at a voltage between the intermediate voltage and the voltage $V_L$ is $T_{fl}$, then the following inequalities are established.

$$T_{rl} < T_{rm} < T_{ru}$$

$$T_{fu} < T_{fm} < T_{fl}$$

That is, as the transition in voltage proceeds, the delay amount increases regardless of the direction of the transition in voltage.

Figure 13:
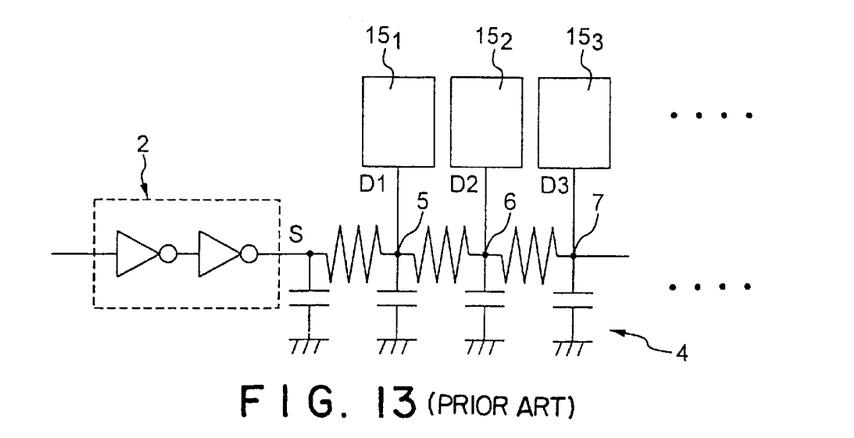
FIG. 13 is a circuit diagram of a conventional semiconductor integrated circuit device.
Figure 14:
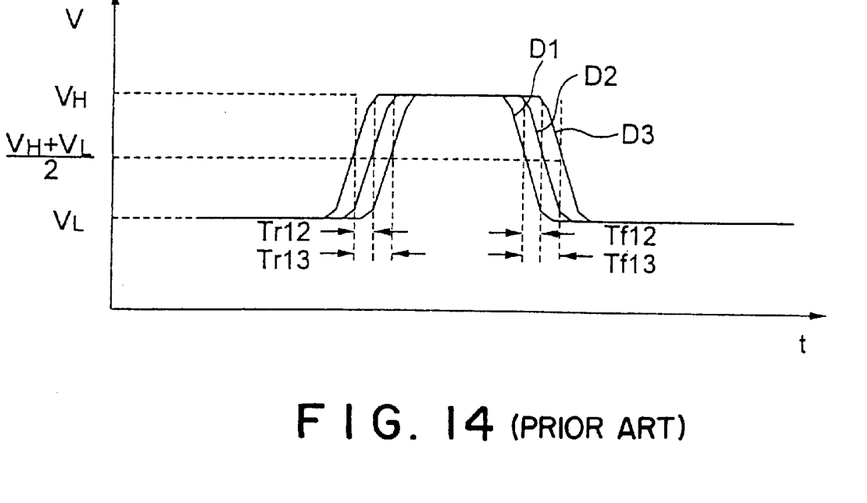
FIG. 14 is a graph showing the operation of the device shown in FIG. 13.

FIG. 13 is a circuit diagram of a conventional semiconductor integrated circuit device wherein clock loadings $15_1$, $15_2$ and $15_3$ serving as logic circuits are connected to the nodes 5, 6 and 7 of the RC-distributed network 4 shown in FIG. 11. FIG. 14 shows voltage waveforms $D_i$ at the inputs of the clock loadings $15_i$ (i=1, 2, 3).

Since the wiring lengths from the output S of the clock driver 2 to the nodes 5, 6 and 7, to which the clock loadings $15_1$, $15_2$ and $15_3$ are connected, are different, the propagation of a clock signal is delayed as the clock signal travels from the node 5 to the node 7 as described above, so that the propagation is shown in FIG. 14. At that time, the propagation time differences $T_{r12}$ and $T_{f12}$ of the waveform D2 with respect to the waveform D1, and the propagation time differences $T_{r13}$ and $T_{f13}$ of the waveform D3 with respect to the waveform D1 are clock skews.

Figure 15:
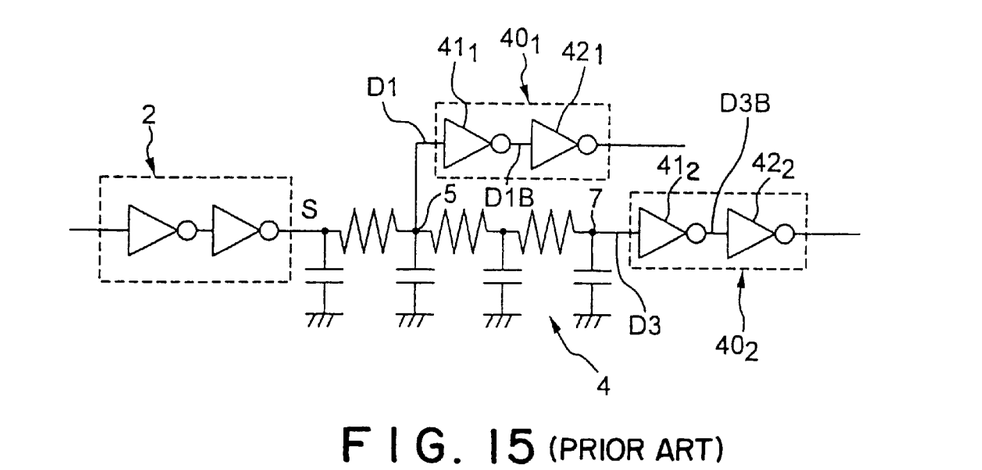
FIG. 15 is a circuit diagram of a conventional semiconductor integrated circuit device.

FIG. 15 shows another conventional semiconductor integrated circuit device. This semiconductor integrated circuit device has the same construction as that of the semiconductor integrated circuit device shown in FIG. 11, except that clock receiver circuits $40_1$, and $40_2$ are connected to the nodes 5 and 7, respectively. Furthermore, synchronously operating logic circuits (not shown) are connected to the respective outputs of the clock receiver circuits $40_1$ and $40_2$.

Figure 16A:
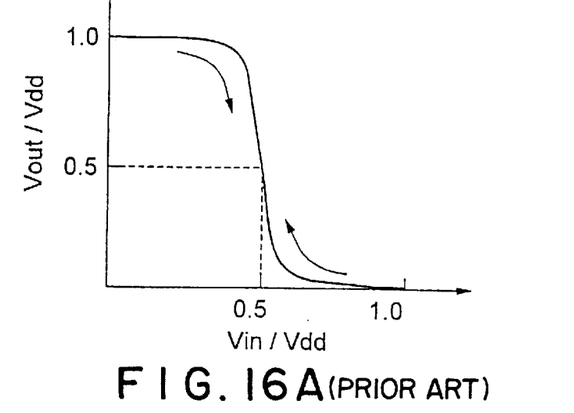
FIG. 16A is a diagram showing the characteristics of an inverter circuit for use in a clock receiver circuit of the device shown in FIG. 15.
Figure 16B:
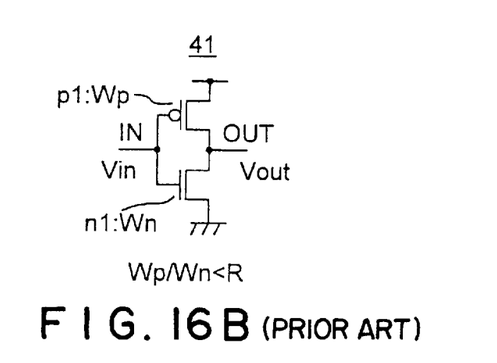
FIG. 16B is a circuit diagram of the inverter circuit for use in the clock receiver circuit of the device shown in FIG. 15.

Inverter circuits 41 and 42 constituting the clock receiver circuit $40_i$ (i=1, 2) are set to have an inversion threshold voltages which is the half of the power supply voltage $V_{dd}$, and 5 have input/output voltage characteristics shown in FIG. 16A. That is, as shown in FIG. 16B, assuming that the gate widths of the p-channel MOS transistor p1 and n-channel MOS transistor n1 constituting each of the inverter circuits 41 and 42 are $W_p$ and $w_n$, respectively, a ratio $w_p/w_n$, of the size of the transistor p1 to the size of the transistor n1 is determined so that the inversion threshold voltage is $V_{dd}/2$. In this case, assuming that the ratio $w_p/w_n$ is R, i.e., $w_p/w_n = R$, then R generally approximates 2.

Figure 17A:
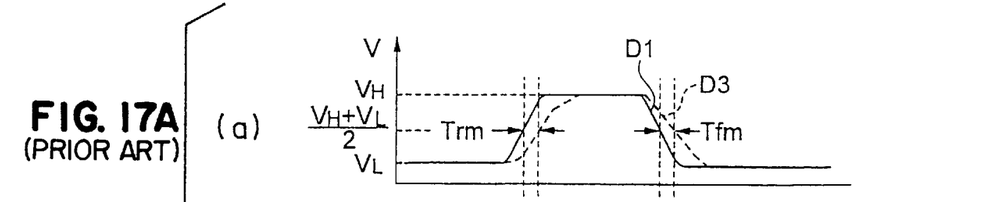
FIGS. 17(a) and 17(b) are graphs for explaining the operation of the inverter circuit for use in the clock receiver circuit of the device shown in FIG. 15.
Figure 17B:
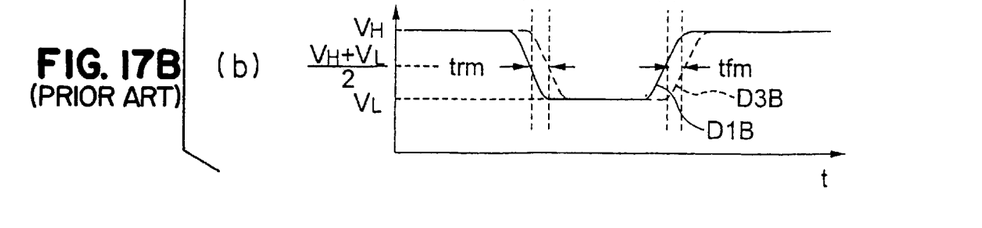

Assuming that the voltages at the respective inputs of the first stage of inverter circuits $41_1$ and $41_2$ constituting the clock receivers $40_1$ and $40_2$ are D1 and D3, respectively, and assuming that the voltages at the respective outputs of the inverter circuits $41_1$, and $41_2$ are D1B and D3B, respectively, then the input voltages D1 and D3 change as shown in FIG. 17(a), and the output voltages D1B and D3B change as shown in FIG. 17(b). That is, since the wiring length from the output of the clock driver 2 to the node 7 is longer than that to the node 5, the input voltage D3 has a waveform having obtuse leading and trailing edges in comparison with the waveform of the input voltage D1 (see FIG. 17(a)). Therefore, a time lag $t_{rm}$ at the trailing edge and time lag $t_{fm}$ at the leading edge of the output voltage D3B with respect to the output voltage D1B are substantially the same as the time lags $T_{fm}$ and $T_{fm}$ of the input voltage, respectively (see FIG. 17(a) and 17(b)). This causes clock skew.

In a typical semiconductor integrated circuit device, the wiring lengths from the clock driver 2 to the nodes, to which the synchronously operating logic circuits or the clock receivers are connected, are fixed, and it is not often possible to reduce the capacities of the clock receiver circuits and so. In order to reduce the above described clock skew in such a case, it is required to increase the wiring width of the clock wiring or to detour to extend the clock wiring of the node near the output of the clock driver so that the delay amount at the node matches with that at the farthest node. In either case, there is a problem in that the layout area increases.

In general, the clock wiring is designed to have a large wiring width to reduce skew, and is laid out around various places on a chip, so that the increase of the wiring width or the introduction of the excessive detour wiring has a great influence on the layout area.

SUMMARY OF THE INVENTION

It is therefore an object of the present invention to eliminate the aforementioned problems and to provide a semiconductor integrated circuit device capable of reducing clock skew and preventing an increase in layout area.

In order to accomplish the aforementioned and other objects, according to one aspect of the present invention, a semiconductor integrated circuit device comprises: a clock driver for outputting a clock signal; a clock wiring which is driven by the clock driver for transmitting the clock signal; a plurality of logic circuits which are connected to the clock wiring to be synchronously operated in response to the clock signal; and a plurality of delay circuits, each of which is provided between a corresponding one of the logic circuits and the clock wiring for delaying the clock signal, wherein a delay amount of each of the delay circuits is designed so that the delay amounts of the clock signal from the output of the clock driver to the inputs of the logic circuits are equal to each other.

Each of the delay circuits may have a resistive element. Alternatively, each of the delay circuits may have a buffer element.

According to another aspect of the present invention, a semiconductor integrated circuit device comprises: a clock driver for outputting a clock signal; a clock wiring which is driven by the clock driver for transmitting the clock signal; and a plurality of clock receiver circuits, each of which has an inverter connected to the clock wiring for receiving the clock signal, wherein the inverter is designed so that an inversion threshold voltage is different from $(V_H + V_L)/2$ when the clock signal changes from a high potential $V_H$ to a low potential $V_L$ and/or from the low potential $V_L$ to the high potential $V_H$.

Preferably, the inverter has a p-channel MOS transistor and an n-channel MOS transistor, and a ratio of an effective size of the p-channel MOS transistor to that of the n-channel MOS transistor is different from that when the inversion threshold voltage is $(V_H + V_L)/2$.

The inverter may be designed so that the inversion threshold voltage is higher than $(V_H + V_L)/2$ when the clock signal changes from the high potential $V_H$ to the low potential $V_L$, and lower than $(V_H + V_L)/2$ when the clock signal changes from the low potential $V_L$ to the high potential $V_H$.

The inverter may comprise: a first p-channel MOS transistor and a first n-channel MOS transistor, the drains of the first p-channel MOS transistor and the first n-channel MOS transistor being commonly connected; second and third p-channel MOS transistors, the drains of which are connected to the source of the first p-channel and the sources of which are connected to a first power supply; second and third n-channel MOS transistors, the drains of which are connected to the source of the first n-channel MOS transistor and the sources of which are connected to a second power supply; and a delay circuit, the input of which is connected to the drains of the first p-channel MOS transistor and the first n-channel MOS transistor and the output of which is connected to the gates of the third p-channel MOS transistor and the third n-channel MOS transistor, wherein the gates of the first and second p-channel MOS transistors and the gates of the first and second n-channel MOS transistors are commonly connected to receive the clock signal to output an output signal from the drains of the first p-channel MOS transistor and the first n-channel MOS transistor.

In the semiconductor integrated circuit device, a ratio of the size of the first p-channel MOS transistor to the size of the first n-channel MOS transistor, a ratio of the size of the second p-channel MOS transistor to the size of the second n-channel MOS transistor, and a ratio of the size of the third p-channel MOS transistor to the size of the third n-channel MOS transistor may be equal to each other, the size of the second p-channel MOS transistor being smaller than the size of the third p-channel MOS transistor, and the size of the second n-channel MOS transistor being smaller than the size of the third n-channel MOS transistor.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of a semiconductor integrated circuit device according to the present invention will be described below.

(First Preferred Embodiment)

Figure 1:
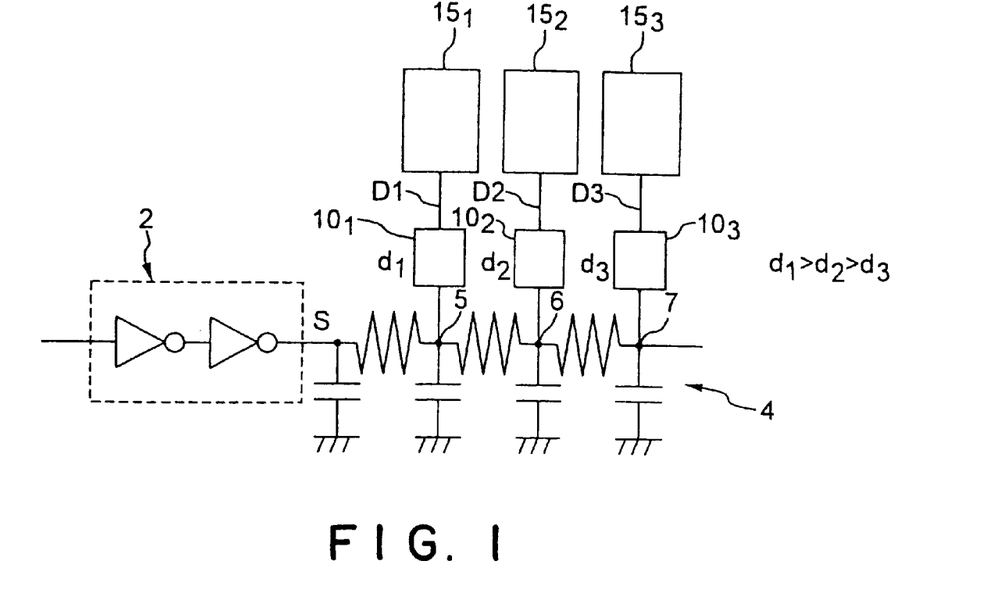
FIG. 1 is a circuit diagram of the first preferred embodiment of the present invention.

FIG. 1 shows the first preferred embodiment of a semiconductor integrated circuit device according to the present invention. In this preferred embodiment, the semiconductor integrated circuit device comprises a clock driver 2, an RC-distributed network 4 which is driven by the clock driver 2 to serve as a clock wiring and which comprises resistors and capacitors, delay circuits $10_1$, $10_2$ and $10_3$, and clock loadings $15_1$, $15_2$ and $15_3$ serving as synchronously operating logic circuits. This semiconductor integrated circuit device has the same construction as that of the conventional semiconductor integrated circuit device shown in FIG. 13, except that the delay circuits $10_1$, $10_2$ and $10_3$ are inserted between the nodes 5, 6, 7 of the RC-distributed network 4 and the clock loadings $15_1$, $15_2$ and $15_3$, respectively.

The delay amounts $d_i$ (i=1, 2, 3) of the respective delay circuits $10_i$ are set so that the delays of the clock signal from the output of the clock driver 2 to the corresponding clock loadings $15_i$ are equal to each other. That is, the delay amounts meet $d_1 > d_2 > d_3$.

Figure 2:
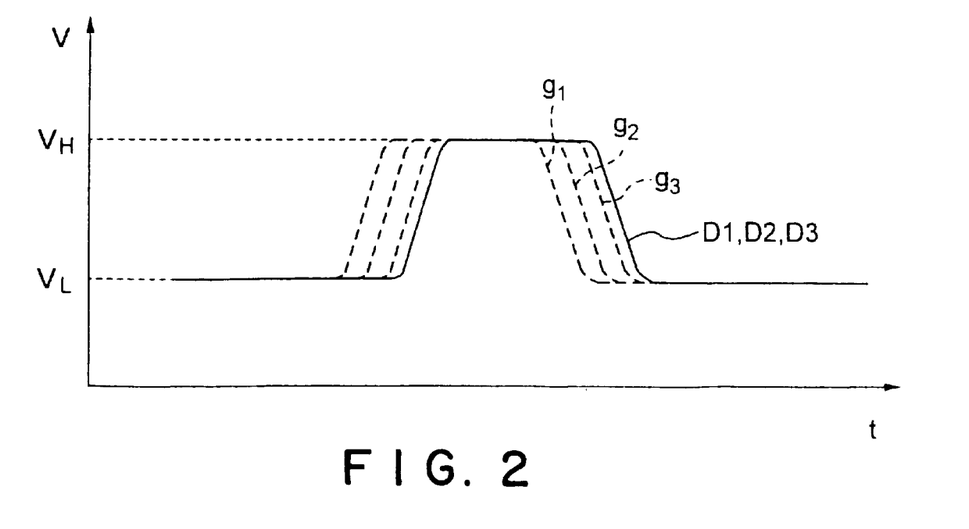
FIG. 2 is a graph for explaining the advantageous effects of the first preferred embodiment.

Assuming that the voltage waveforms of the clock signals at the nodes 5, 6 and 7 are expressed $g_1$, $g_2$ and $g_3$, respectively, and assuming that the voltage waveforms at the inputs of the clock loadings $15_i$ (i=1, 2, 3) are expressed by Di, these waveforms are shown in FIG. 2. That is, although the clock signals at the nodes 6 and 7 are delayed from the clock signal at the node 5, the voltage waveforms at the inputs of the clock loadings $15_1$, $15_2$ and $15_3$ are matched with each other, so that there is no clock skew.

As described above, according to this preferred embodiment, it is possible to remove clock skew. In addition, by providing the above described delay circuits, it is possible to evade the increase in layout area in comparison with the cases where the wiring width of the clock wiring is increased and where the clock wiring is extended.

(Second Preferred Embodiment)

Figure 3:
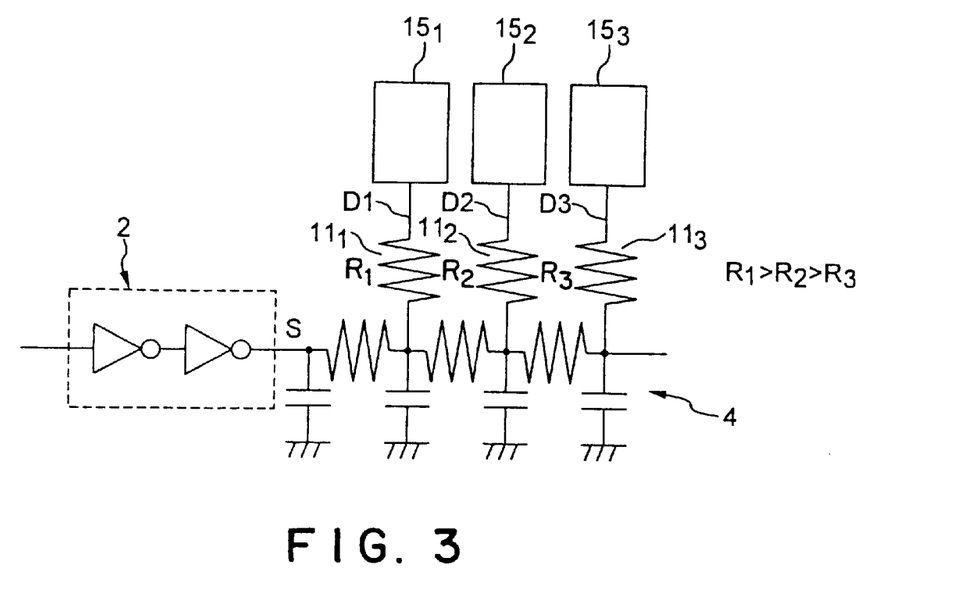
FIG. 3 is a circuit diagram of the second preferred embodiment of the present invention.

FIG. 3 shows the second preferred embodiment of a semiconductor integrated circuit device according to the present invention. In the semiconductor integrated circuit device according to the second preferred embodiment, resistive elements 11i are used as the delay circuits $10_i$ (i=1, 2, 3) of the semiconductor integrated circuit device in the first preferred embodiment.

The values $R_i$ of resistance of the resistive elements 11i (i=1, 2, 3) are set so that the delay amounts of the clock signals, which are outputted from the output of the clock driver 2, at the inputs of the clock loadings $15_1$, $15_2$ and $15_3$ are equal to each other. Therefore, the values $R_1$, $R_2$ and $R_3$ of resistance meet $R_1 > R_2 > R_3$. That is, as the wiring length to the clock driver 2 is shorter, the resistive element has a greater value of resistance.

Furthermore, if the resistive element is made of a diffusion layer, the resistive element can have a high value of resistance even if it has a small area.

The second preferred embodiment has the same advantages as those of the first preferred embodiment.

(Third Preferred Embodiment)

Figure 4:
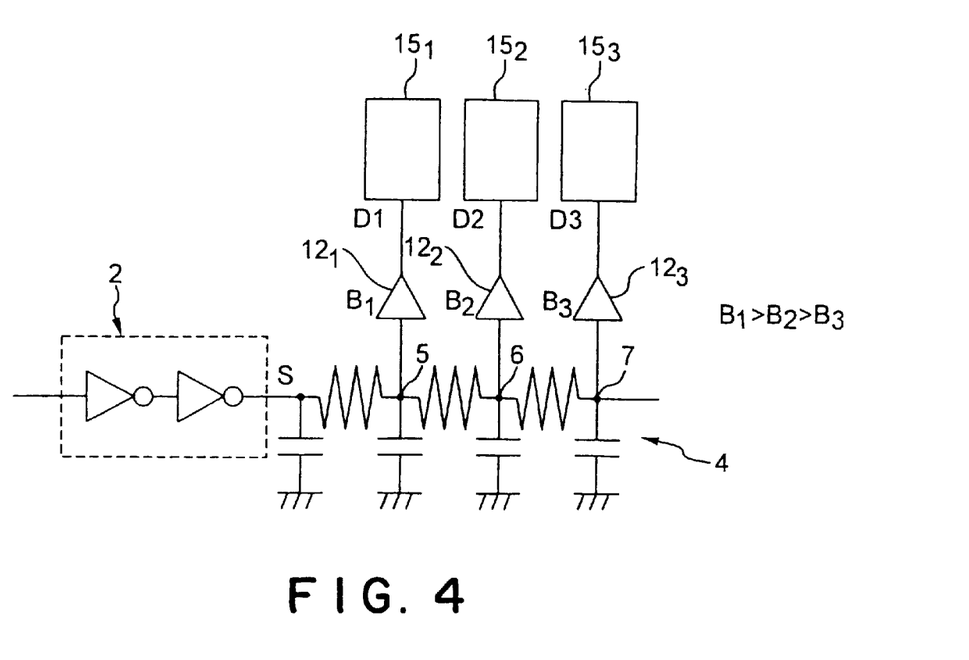
FIG. 4 is a circuit diagram of the third preferred embodiment of the present invention.

FIG. 4 shows the third preferred embodiment of a semiconductor integrated circuit device according to the present invention. In the semiconductor integrated circuit device according to the third preferred embodiment, buffer elements $12_i$ are used as the delay circuits $10_i$ (i=1, 2, 3) of the semiconductor integrated circuit device in the first preferred embodiment.

The delay values $B_i$ of the buffer elements 12i (i=1, 2, 3) are adjustable by the sizes (gate widths) of the transistors constituting the buffer elements $12_i$, and are set so that the delay amounts of clock signals, which are outputted from the output of the clock driver 2, at the inputs of the clock loadings $15_1$, $15_2$ and $15_3$ are equal to each other. Therefore, the delay values $B_1$, $B_2$ and $B_3$ meet $B_1 > B_2 > B_3$. That is, as the wiring length to the clock driver 2 is shorter, the buffer element has a greater delay value.

The third preferred embodiment also has the same advantages as those of the first preferred embodiment.

Furthermore, since the delay amount can be adjusted by easily changeable parameters, such as the gate width of the transistor constituting the buffer element, it is possible to reduce clock skew with small design costs.

(Fourth Preferred Embodiment)

Figure 5:
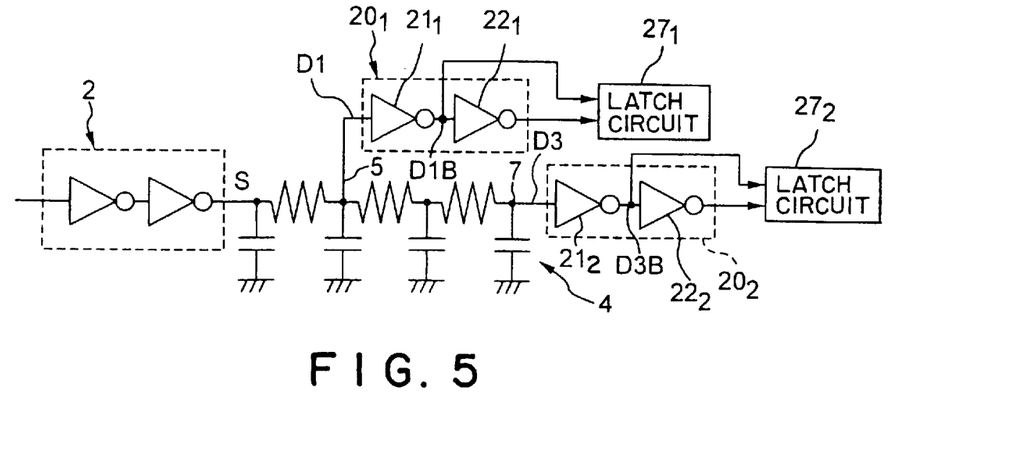
FIG. 5 is a circuit diagram of the fourth preferred embodiment of the present invention.

FIG. 5 shows the fourth preferred embodiment of a semiconductor integrated circuit device according to the present invention. In this preferred embodiment, the semiconductor integrated circuit device comprises a clock driver 2, an RC-distributed network 4 which is driven by the clock driver 2 to serve as a clock wiring and which has resistors and capacitors, clock receiver circuits $20_1$ and $20_2$, and latch circuits $27_1$ and $27_2$. This semiconductor integrated circuit device has the same construction as that of the conventional semiconductor integrated circuit device shown in FIG. 15, except that the clock receiver circuits $40_1$ and $40_2$ are replaced with the clock receiver circuits $20_1$ and $20_2$ and that the latch circuits $27_i$ are connected to the outputs of the clock receiver circuits $20_i$ (i=1, 2).

Figure 6A:
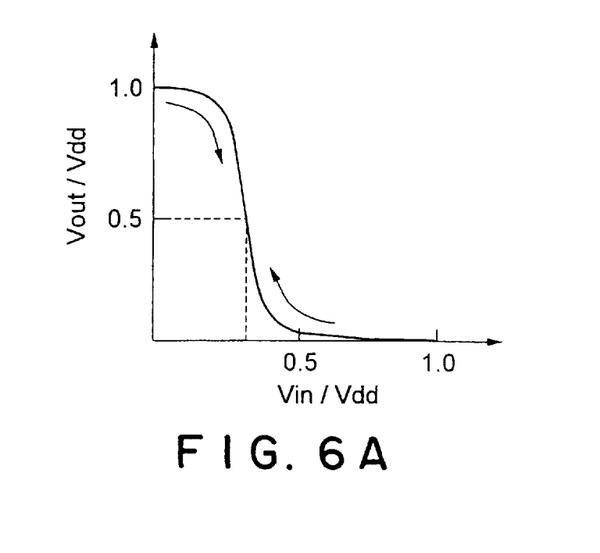
FIG. 6A is a diagram showing the characteristics of an inverter circuit for use in the fourth preferred embodiment of a clock receiver circuit according to the present invention.
Figure 6B:
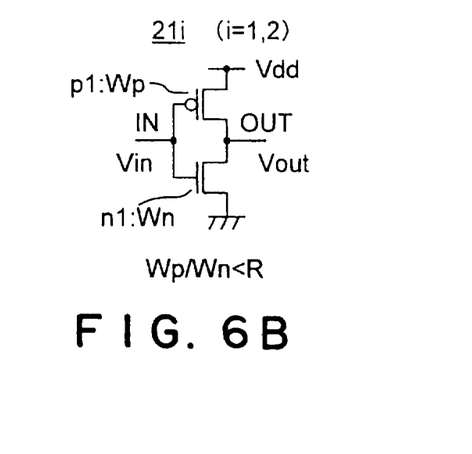
FIG. 6B is a circuit diagram of the inverter circuit for use in the fourth preferred embodiment of a clock receiver circuit according to the present invention.

Each of the clock receiver circuits $20_i$ (i=1, 2) comprises two cascade-connected inverter circuits $21_i$ and $22_i$. The second stage of inverter circuit $22_i$ (i=1, 2) has the same characteristics as those in the conventional case shown in FIG. 16A, i.e., characteristics that an inversion threshold voltage (an input voltage when an output voltage $V_{out}$ is $V_{dd}/2$) is $V_{dd}/2$. On the other hand, the first stage of inverter circuit $21_i$ (i=1, 2) has characteristics shown in FIG. 6A. That is, the inversion threshold voltage of the inverter circuit $21_i$ (i=1, 2) is designed to be lower than $V_{dd}/2$. This means that the ratio $w_p/w_n$ of the gate width $w_p$ of the p-channel MOS transistor p1 to the gate width $w_n$ the n-channel MOS transistor n1, which constitute the inverter circuit $21_i$ (i=1, 2), is set to be less than a value R. The value R is a ratio of the gate width of the p-channel MOS transistor to the gate width of the n-channel MOS transistor, which constitute an inverter circuit having a threshold voltage of $V_{dd}/2$.

The latch circuit $27_i$ (i=1, 2) performs latch operation in synchronism with the outputs of the inverter circuits 21 and 22 of the clock receiver circuit $20_i$.

Figure 7:
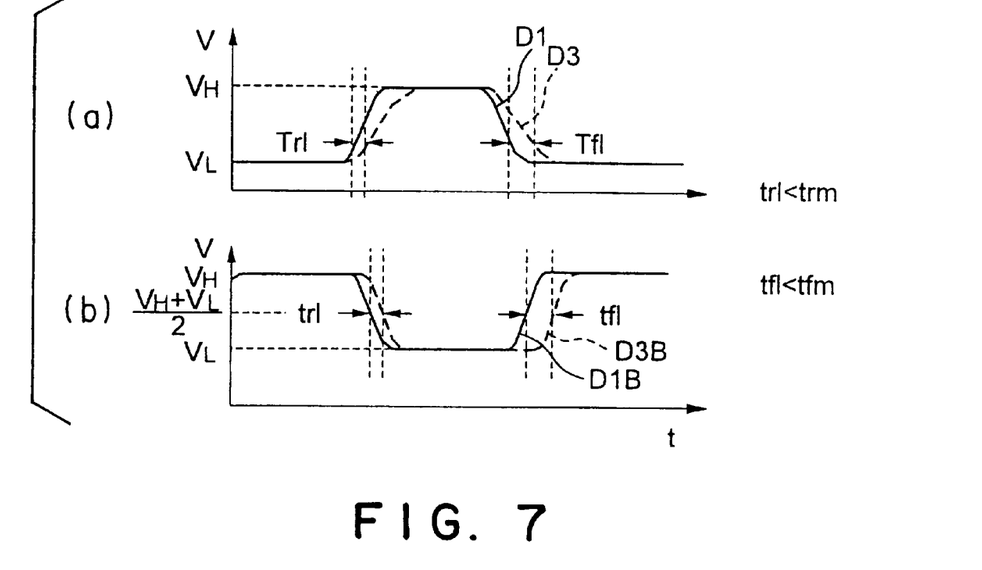
FIG. 7 is a graph for explaining the operation of the inverter circuit for use in the fourth preferred embodiment of a clock receiver circuit according to the present invention.

Assuming that the voltages of the respective inputs of the first stage of inverter circuits $21_1$ and $21_2$ of the clock receiver circuits $20_1$ and $20_2$ with the above described constructions are D1 and D3, and assuming that the voltages of the respective outputs of the inverter circuits $21_1$ and $21_2$ are D1B and D3B, then the input voltages D1 and D3 change as shown in FIG. 7(a) and the output voltages D1B and D3B change as shown in FIG. 7(b). That is, since the inversion threshold voltages of the inverter circuits $21_1$ and $21_2$ are set to be lower than $V_{dd}/2$, even if the leading edge of the input voltage D3 is more obtuse than that of the input voltage D1 due to the difference in wiring length when the input voltages D1 and D3 change from $V_L$ to $V_H$, the inverting timing of the inverter circuits $21_1$ and $21_2$ is earlier than that in the conventional case, and the switching of the inverter occurs when the time difference between the input voltages D1 and D3 is $T_{rl}$ (see FIG. 7(a)). Furthermore, in the conventional case shown in FIG. 15, the switching of the inverter occurs when the time difference is $T_{rm}$ (>$T_{rl}$) as shown in FIG. 17(a).

Thus, when each of the output voltages D1B and D3B of the inverters $21_1$ and $21_2$ is $(V_H+V_L)/2$, the delay is $t_{rl}$ as shown in FIG. 7(b), which is less than the delay $t_{rm}$ in the conventional case (see FIG. 17(b)).

However, when the input voltages D1 and D3 change from $V_H$ to $V_L$, the inverting timing of the inverter circuits $21_1$ and $22_2$ is delayed from that in the conventional case, and when the time difference between the input voltages D1 and D3 is $T_{fl}$, the switching of the inverter occurs. Furthermore, in the conventional case, when the time difference is $T_{fm}$ (<$T_{fl}$), the switching of the inverter occurs.

Therefore, when each of the output voltages D1B and D3B of the inverters $21_1$ and $21_2$ is $(V_H+V_L)/2$, the delay is $t_{fl}$ as shown in FIG. 7(b), which is greater than the delay $t_{rm}$ in the conventional case (see FIG. 17(b)).

As described above, according to this preferred embodiment, if the ratio of the sizes (gate widths) of the transistors constituting the first stage of inverters of the clock receiver circuits $20_i$ (i=1, 2) is set to be $w_p/w_n$<R, when the clock signal changes from $V_L$ to $V_H$, clock skew can be less than that in the conventional case. In this case, the layout area is substantially the same as that in the conventional case, or the increase in layout area is very small.

Furthermore, in the fourth preferred embodiment, the ratio $w_p/w_n$ of the gate width $w_p$ of the p-channel MOS transistor p1 to the gate width $w_n$ of the n-channel MOS transistor n1, which constitute the inverter circuits $21_i$ (i=1, 2), is set to be smaller than the predetermined value R. However, if the ratio $w_p/w_n$ is set to be greater than the predetermined value R, when the clock signals inputted to the inverter circuits $21_i$ (i=1, 2) change from $V_H$ to $V_L$, clock skew can be smaller than that in the conventional case.

Therefore, by adjusting the ratio of the gate widths of the transistors, it is possible to reduce clock skew when the clock signal changes from $V_L$ to $V_H$ or $V_H$ to $V_L$. This is effective when the phase of the latches connected to the clock line on the lower hierarchy of the clock tree is unified to either of master and slave or when flip-flops are connected.

Furthermore, while each of the clock receiver circuits $20_i$ (i=1, 2) has had two cascade-connected inverter circuits $21_i$ and $22_i$ in this preferred embodiment, it may have at least one inverter circuit $21_i$.

(Fifth Preferred Embodiment)

Figure 8:
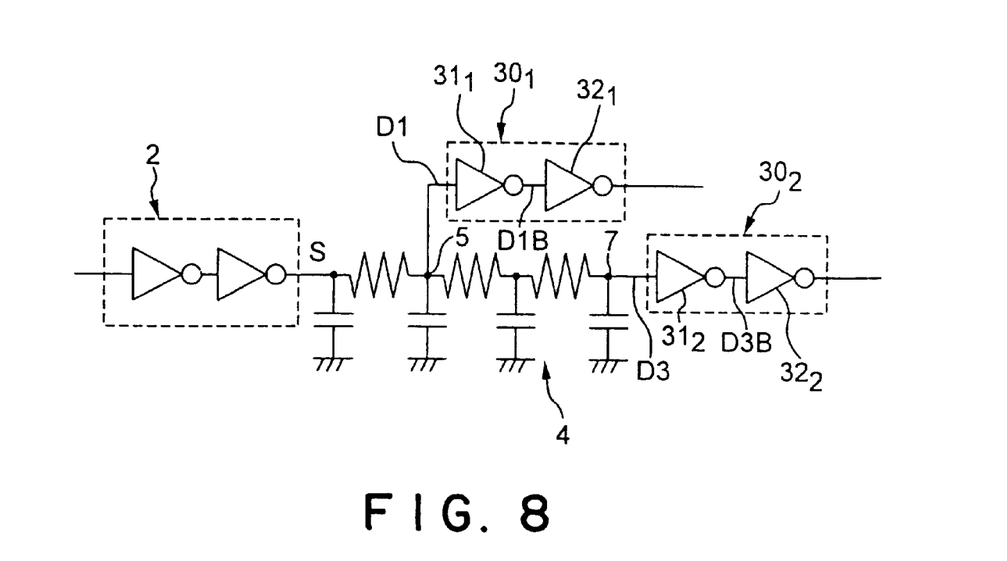
FIG. 8 is a circuit diagram of the fifth preferred embodiment of the present invention.

FIG. 8 shows the fifth preferred embodiment of a semiconductor integrated circuit device according to the present invention. In this preferred embodiment, the semiconductor integrated circuit device comprises a clock driver 2, an RC-distributed network 4 which is driven by the clock driver 2 to serve as a clock wiring and which has resistors and capacitors, and clock receiver circuits $30_1$ and $30_2$. This semiconductor integrated circuit device has the same construction as that of the conventional semiconductor integrated circuit device shown in FIG. 15, except that the clock receiver circuits $40_1$ and $40_2$ are replaced with the clock receiver circuits $30_1$ and $30_2$. Furthermore, synchronously operating logic circuits (not shown) are connected to the respective outputs of the clock receiver circuits $30_1$ and $30_2$.

Figure 9A:
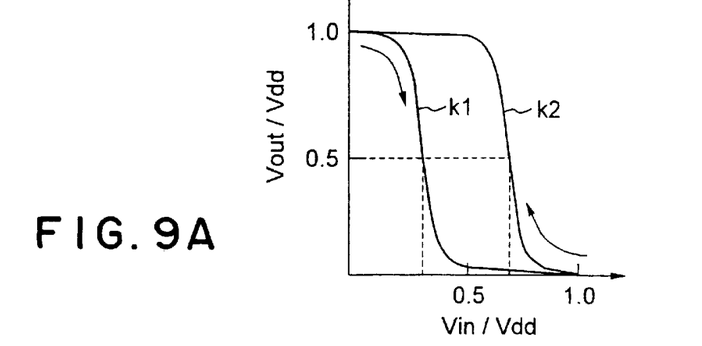
FIG. 9A is a diagram showing the characteristics of an inverter circuit for use in the fifth preferred embodiment of a clock receiver circuit according to the present invention.

Each of the clock receiver circuits $30_i$ (i=1, 2) comprises two cascade-connected inverter circuits $31_i$ and $32_i$. The second stage of inverter circuit $32_i$ (i=1, 2) has the same characteristics as those in the conventional case shown in FIG. 16A, i.e., characteristics that the inversion threshold voltage is $V_{dd}/2$. On the other hand, the first stage of inverter circuit $31_i$ (i=1, 2) has characteristics shown in FIG. 9A. That is, the inversion threshold voltage of the inverter circuit $31_i$ (i=1, 2) is designed to be lower than $V_{dd}/2$ when the input voltage $V_{in}$ changes from $V_L$ (=0) to $V_H$ (=Vdd) (see $k_1$ in FIG. 9A), and higher than $V_{dd}/2$ when the input voltage $V_{in}$ changes from $V_H$ to $V_L$ (see $k_2$ in FIG. 9A).

Figure 9B:
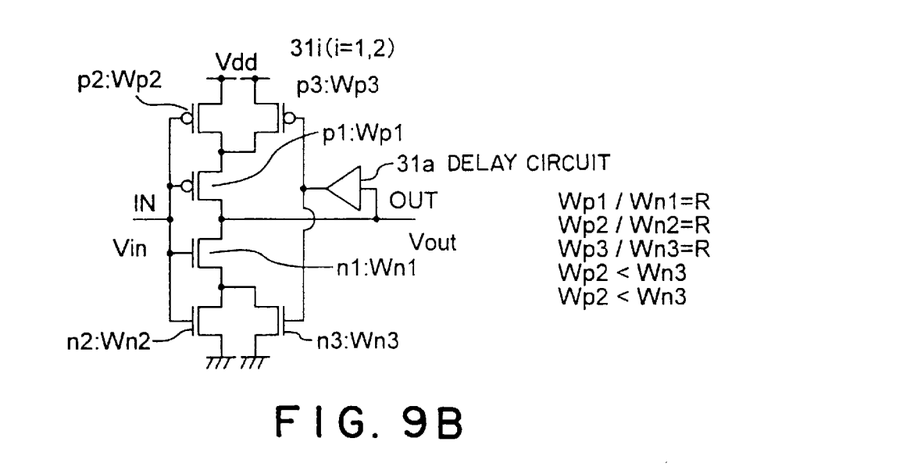
FIG. 9B is a circuit diagram of the inverter circuit for use in the fifth preferred embodiment of a clock receiver circuit according to the present invention.

FIG. 9B shows an example of an inverter circuit $31_i$ (i=1, 2) having an inversion threshold voltage which changes in accordance with the transition direction of the input voltage $V_{in}$.

This inverter circuit comprises p-channel MOS transistors p1, p2 and p3, n-channel MOS transistor n1, n2 and n3, and a delay circuit 31a.

The drains of the transistor p1 and transistor n1 are commonly connected. The drain of the transistor p2 is connected to the source of the transistor p1, and the source of the transistor p2 is connected to a drive power supply. In addition, the drain of the transistor n2 is connected to the source of the transistor n1, and the source of the transistor n2 is connected to the ground power supply. The gates of the transistors p1, p2, n1 and n2 are commonly connected to serve as an input terminal IN, to which the input voltage $V_{in}$ is applied. In addition, the source of the transistor p3 is connected to the drive power supply, and the drain of the transistor p3 is connected to the drain of the transistor p2. The source of the transistor n3 is connected to the ground power supply, and the drain of the transistor n3 is connected to the drain of the transistor n2.

The input of the delay circuit 31a is connected to the output OUT of the inverter circuit, i.e., to the drains of the transistors p1 and transistor n1. The output of the delay circuit 31a is connected to the gates of the transistor p3 and transistor n3.

Furthermore, assuming that the gate widths of the transistors p1, p2 and p3 are $w_{p1}$, $w_{p2}$ and $w_{p3}$, respectively, and assuming that the gate widths of the transistors n1, n2 and n3 are $w_{n1}$, $w_{n2}$ and $W_{n3}$, respectively, then the following formulae are established.

$$w_{p1}/w_{n1}=w_{p2}/w_{n2}=w_{p3}/w_{n3}=R$$

$$w_{p2}<w_{p3}$$

$$w_{n2}<w_{n3}$$

wherein R is the predetermined value described in the fourth preferred embodiment.

In the inverter circuit with this construction, when the potential of the input terminal IN is, e.g., 0, the transistors p1 and p2 are turned ON, and the transistors n1 and n2 are turned OFF, so that the potential of the output terminal OUT is $V_{dd}$. At this time, $V_{dd}$ is transmitted via the delay circuit 31a, so that the transistor p3 is turned OFF and the transistor n3 is turned ON. When the potential of the input terminal IN changes from 0 to $V_{dd}$, the transistors p1 and p2 are turned OFF, and the transistors n1 and n2 are turned ON. At this time, the voltage of the output terminal OUT gradually changes from $V_{dd}$ to 0, and the OFF state of the transistor p3 and the ON state of the transistor n3 are held for some time since the delay circuit 31a is provided. As a result, the effective ratio of the gate widths of the p-channel transistor and n-channel transistor of the inverter circuit is $w_p/w_n = w_{p2}/(w_{n2}+w_{n3})$ <R, so that the inversion threshold voltage is lower than $V_{dd}/2$. Therefore, the input/output voltage characteristic is expressed by $k_1$ in FIG. 9A. Conversely, when the potential of the input terminal IN changes from $V_{dd}$ to 0, $w_p/w_n=(w_{p2}+W_{p3})/W_{n2}>R$, so that the inversion threshold voltage increases to exceed $V_{dd}/2$. Therefore, the input/output voltage characteristics show the curve that the output voltage is inverted in a high input voltage region (see $k_2$ in FIG. 9A). As a result, the input/output voltage characteristic has hysteresis (see FIG. 9A).

Figure 10:
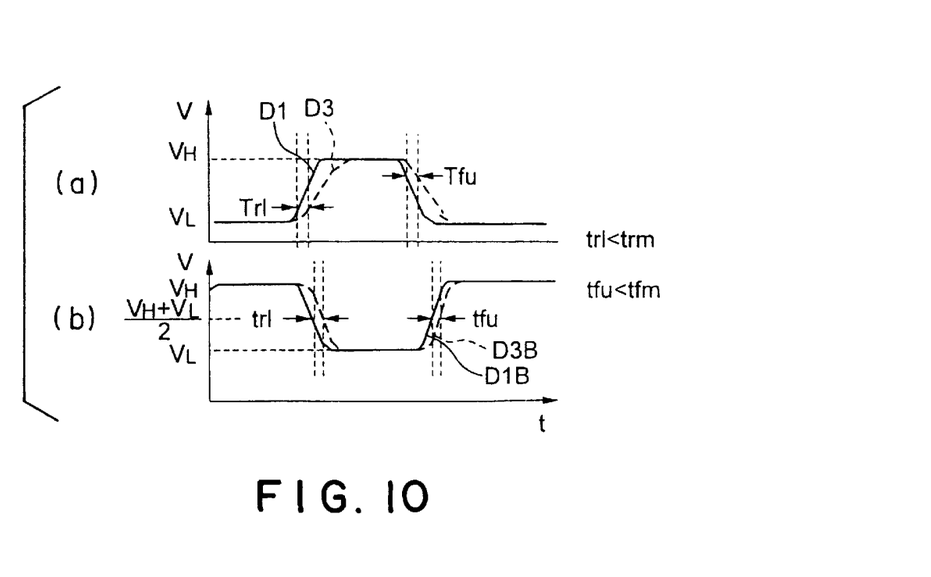
FIG. 10 is a graph for explaining the operation of the inverter circuit for use in the fifth preferred embodiment of a clock receiver circuit according to the present invention.

Assuming that the voltages of the respective inputs of the first stage of inverter circuits $21_1$ and $21_2$ of the clock receiver circuits $30_1$ and $30_2$ with the above described constructions are D1 and D3, and assuming that the voltages of the respective outputs of the inverter circuits $21_1$ and $21_2$ are D1B and D3B, then the input voltages D1 and D3 change as shown in FIG. 10(a) and the output voltages D1B and D3B change as shown in FIG. 10(b). That is, when the input voltages D1 and D3 change from $V_L$ (=0) to $V_H$ (=$V_{dd}$), switching occurs at a lower voltage than $V_{dd}/2$, so that the time difference (clock skew) $t_{r1}$ when the output voltages D1B and D3B reach $(V_H+V_L)/2$ can be substantially the same as the time difference $T_{rl}$ when the input voltages D1 and D3 reach the threshold voltage, to be less than the conventional time difference $t_{rn}$. In addition, when the input voltages D1 and D3 change from $V_H$ to $V_L$, switching occurs at a higher voltage than $V_{dd}/2$, so that the time difference (clock skew) $t_{fu}$ when the output voltages D1B and D3B reach $(V_H+V_L)/2$ can be substantially the same as the time difference $T_{fu}$ when the input voltages D1 and D3 reach the threshold voltage, to be less than the conventional time difference $t_{fn}$.

As described above, it is possible to reduce the skew of the clock signal inputted to the logic circuit regardless of the transition direction when the clock signal changes, in comparison with the conventional case. In addition, although the transistor count of the first stage of inverter circuits $31_1$ and $31_2$ of the clock receiver circuits $30_1$ and $30_2$ increases in comparison with that in the conventional case, it is possible to suppress the increase of the area in comparison with the increase of the area when the clock wiring and excessive detour wiring are introduced.

Furthermore, while each of the clock receiver circuits $30_i$ (i=1, 2) has had two cascade-connected inverter circuits $31_i$ and $32_i$ in this preferred embodiment, it may have at least one inverter circuit $31_i$.

As described above, according to the present invention, it is possible to reduce clock skew and to evade an increase in layout area.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor integrated circuit device comprising:
   a clock driver for outputting a clock signal;
   a clock wiring which is driven by said clock driver for transmitting said clock signal;
   a plurality of logic circuits which receive said clock signal from said clock wiring; and
   a plurality of delay circuits, each of which is provided between a corresponding one of said logic circuits and said clock wiring for delaying said clock signal,
   wherein as a wiring length to the clock driver is shorter, the delay circuits have a greater delay amount, such that the delay amounts of said clock signal from the output of said clock driver to the inputs of said logic circuits are equal to each other.

2. A semiconductor integrated circuit device as set forth in claim 1, wherein each of said delay circuits has a resistive element.

3. A semiconductor integrated circuit device as set forth in claim 1, wherein each of said delay circuits has a buffer element.

4. A semiconductor integrated circuit device comprising:
   a clock driver for outputting a clock signal;
   a clock wiring which is driven by said clock driver for transmitting said clock signal; and
   a plurality of clock receiver circuits, each of which has an inverter which receives said clock signal from said clock wiring,
   wherein said inverter has a first inversion threshold voltage when said clock signal changes from a high potential $V_H$ to a low potential $V_L$ and a second inversion threshold voltage when said clock signal changes from the low potential $V_L$ to the high potential $V_H$, the first inversion threshold voltage being different from the second inversion threshold voltage.

5. A semiconductor integrated circuit device as set forth in claim 4, wherein said inverter is designed so that said inversion threshold voltage is higher than $(V_H+V_L)/2$ when said clock signal changes from said high potential $V_H$ to said low potential $V_L$, and lower than $(V_H+V_L)/2$ when said clock signal changes from said low potential $V_L$ to said high potential $V_H$.

6. A semiconductor integrated circuit device as set forth in claim 4, wherein said inverter has a p-channel MOS transistor and an n-channel MOS transistor, and a ratio of an effective size of said p-channel MOS transistor to that of said n-channel MOS transistor is different from that when said inversion threshold voltage is $(V_H+V_L)/2$.

7. A semiconductor integrated circuit device as set forth in claim 6, wherein said inverter is designed so that said inversion threshold voltage is higher than $(V_H+V_L)/2$ when said clock signal changes from said high potential $V_H$ to said low potential $V_L$, and lower than $(V_H+V_L)/2$ when said clock signal changes from said low potential $V_L$ to said high potential $V_H$.

8. A semiconductor integrated circuit device as set forth in claim 5, wherein said inverter comprises:
   a first p-channel MOS transistor and a first n-channel MOS transistor, the drains of said first p-channel MOS transistor and said first n-channel MOS transistor being commonly connected;
   second and third p-channel MOS transistors, the drains of which are connected to the source of said first p-channel and the sources of which are connected to a first power supply;
   second and third n-channel MOS transistors, the drains of which are connected to the source of said first n-channel MOS transistor and the sources of which are connected to a second power supply; and
   a delay circuit, the input of which is connected to the drains of said first p-channel MOS transistor and said first n-channel MOS transistor and the output of which is connected to the gates of said third p-channel MOS transistor and third n-channel MOS transistor,
   wherein the gates of said first and second p-channel MOS transistors and the gates of said first and second n-channel MOS transistors are commonly connected to receive said clock signal to output an output signal from the drains of said first p-channel MOS transistor and said first n-channel MOS transistor.

9. A semiconductor integrated circuit device as set forth in claim 8, wherein a ratio of the size of said first p-channel MOS transistor to the size of said first n-channel MOS transistor, a ratio of the size of said second p-channel MOS transistor to the size of said second n-channel MOS transistor, and a ratio of the size of said third p-channel MOS transistor to the size of said third n-channel MOS transistor are equal to each other, the size of said second p-channel MOS transistor being smaller than the size of said third p-channel MOS transistor, and the size of said second n-channel MOS transistor being smaller than the size of said third n-channel MOS transistor.

\* \* \* \* \*